United States Patent
Yu et al.

(10) Patent No.: US 8,514,559 B2
(45) Date of Patent: Aug. 20, 2013

(54) SCREEN STORAGE DEVICE

(75) Inventors: Hong-Chi Yu, Kaohsiung (TW);
Mao-Ting Chang, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 304 days.

(21) Appl. No.: 12/929,174

(22) Filed: Jan. 6, 2011

(65) Prior Publication Data
US 2012/0120585 A1    May 17, 2012

(30) Foreign Application Priority Data
Nov. 15, 2010    (TW) .............................. 99139224 A

(51) Int. Cl.
*G06F 1/16*    (2006.01)

(52) U.S. Cl.
USPC ................... 361/679.31; 361/679.32; 439/31; 439/67; 439/77

(58) Field of Classification Search
USPC ..................................... 361/679.32
See application file for complete search history.

(56) References Cited

U.S. PATENT DOCUMENTS

| | | | | |
|---|---|---|---|---|
| 5,055,968 A * | 10/1991 | Nishi et al. | ..................... | 361/737 |
| 6,121,676 A * | 9/2000 | Solberg | ...................... | 257/686 |
| 6,473,308 B2 * | 10/2002 | Forthun | ......................... | 361/749 |
| 6,483,038 B2 * | 11/2002 | Lee et al. | ....................... | 174/255 |
| 6,982,869 B2 * | 1/2006 | Larson | ..................... | 361/679.32 |
| 7,413,470 B1 * | 8/2008 | Yu | ................................... | 439/502 |
| 7,487,265 B2 * | 2/2009 | Miller et al. | ....................... | 710/11 |
| 7,537,169 B2 * | 5/2009 | Gonzalez et al. | .............. | 235/492 |
| 8,117,745 B2 * | 2/2012 | Wenngren | ........................ | 29/854 |
| 2002/0167791 A1 * | 11/2002 | Goris | ............................ | 361/684 |
| 2003/0168725 A1 * | 9/2003 | Warner et al. | .................. | 257/686 |
| 2004/0009708 A1 * | 1/2004 | Gochnour et al. | .............. | 439/638 |
| 2004/0033727 A1 * | 2/2004 | Kao | ................................ | 439/660 |
| 2006/0003609 A1 * | 1/2006 | Hwang | .......................... | 439/76.1 |
| 2006/0180674 A1 * | 8/2006 | Margalit et al. | ................ | 235/492 |
| 2006/0273154 A1 * | 12/2006 | Dan | ................................ | 235/380 |
| 2006/0278723 A1 * | 12/2006 | Dan et al. | ........................ | 235/492 |
| 2007/0243732 A1 * | 10/2007 | Gu et al. | ......................... | 439/131 |
| 2012/0026672 A1 * | 2/2012 | Yu et al. | .................... | 361/679.32 |
| 2012/0193414 A1 * | 8/2012 | Thibaudeau | ................... | 235/380 |

* cited by examiner

*Primary Examiner* — Anthony Q Edwards
(74) *Attorney, Agent, or Firm* — Bacon & Thomas, P.L.C.

(57) ABSTRACT

The present invention is to provide a screen storage device comprising at least an integrated circuit module and a carrier plate folded to be at least two folding sections in which the height of the integrated circuit module plus the heights of folding sections is not more than the height unit of a Universal Serial Bus (USB) male connector to embody the height of the integrated circuit module in the present invention effectively reduced and the present invention extensively employed, conveniently used, and properly accommodated with the folding section and the integrated circuit module oppositely stacked.

7 Claims, 10 Drawing Sheets

SCREEN STORAGE DEVICE

BACKGROUND OF THE INVENTION

1) Field of the Invention

The present invention relates to a screen storage device, especially to a foldable device structure increasing its thickness.

2) Description of the Prior Art

The Internet era has facilitated information sharing accelerated as well as popularization and progress of information technology. In this regard, a variety of products such as computers and communications & consumer electronics have extensively permeated into consumers' lives.

Recently, the portable data storage device with a data transfer interface and one type of non-volatile memory (for instance, flash memory) integrated has been popularized. In addition, the devices which consist mostly of flash memory components and feature smaller sizes, high portability, and Tbyte-level storage capacity or more due to rapidly developed semiconductor process technologies have received consumers' more and more favor on the purpose of data sharing.

For one USB device, it usually has a USB connector easily plugged into a computer's USB port for data access or storage.

A general USB device's small surface area, however, unfavorable to printing has prompted some business operators to manufacture a USB device with its size near a business card and a bigger surface area for convenient printing and better advertising effect.

With reference to R.O.C. Patent Number M328060, the flash disk comprises a flat case (60) provided with an integrated circuit module inside which is connected to a signal line (61) as well as a Universal Serial Bus (USB) male connector (62) (Series A) of the signal line (61). The case (60) comprises a first panel (601), which is provided with an interconnected narrow cable tray (603) to accommodate a rectangle connector groove (604) of a USB male connector (62) (Series A), and a second panel (602).

Referring to FIGS. 2A and 2B which indicate the standard data transfer interface of a USB male connector (70) (Series A; unit: millimeter (mm)) has a metal frame (71) with the thickness of 4.5 mm±0.1 mm and a partial thickness range (72) for accommodating a plurality of metal contacts (83) and a carrier body (84) on a female connector (80). Next, a thickness range (82) of the female connector (80) is used to accommodate a plurality of metal contacts (73) and a carrier body (74) of the male connector (70). That is, the distance from the carrier body (84) to an outer frame (81) of the female connector (80) is a minimum thickness of the male connector (70).

Accordingly, the thickness of the male connector (70) restricted to the specifications cannot be thinner, and the overall volume and the thickness cause a USB device featuring printing as well as advertising effect inconveniently used or accommodated in a limited space despite some products based on R.O.C. Patent No. M328060 for sale, e.g., the large overall volume for the USB device's male connector (62) plugged into a computer's USB port is unfavorable to use because of the male connector (62) and the case (60) developed to be a interconnected structure; furthermore, the USB device usually placed in a confined space containing but not limited to stationery such as document area or cardcase is not properly accommodated in virtue of its thickness and the overall volume.

Moreover, a USB device's overall thickness not thinner anymore due to specifications of a standard USB connector has resulted in the device neither integrated with other products such as credit card, ATM card, personal ID card (thickness: 1.7~1.9 mm), business card (thickness: 0.3~0.5 mm), or billboard (thickness: 1.8~2.0 mm) nor creating more diversified purposes despite the obviously shrunk volume and the substantially reduced manufacture cost of an integrated circuit module based on the state-of-the-art semiconductor process technologies.

SUMMARY OF THE INVENTION

To solve the said problem, the present invention is to provide a screen storage device plugged into a computer's port (as a data transfer interface) and comprising at least an integrated circuit module and a carrier plate wherein the integrated circuit module is provided with a plurality of metal contacts and the carrier plate is used to carry the integrated circuit module; the metal contacts are exposed outside as the folding section and the integrated circuit module are oppositely stacked; the integrated circuit module's height plus the folding sections' heights is not more than a male connector's height unit by specifications for the data transfer interface of Universal Serial Bus (USB).

Accordingly, an integrated circuit module is combined with the following media: (1) Various materials containing but not limited to an invitation card, a greeting card, a birthday card, a business card, or printed media for supply of a diversified message and a function of information feedback; (2) Direct Mail advertising (DM) for sales messages not restricted by the space of a printed page but displayed in diversified styles with a feedback function transmitting a user's messages; (3) Information from a legal entity, an enterprise, or the competent authorities allowing these messages to be introduced to some specific websites; (4) Personal messages to supply a user other information from MSN, Face Book, or an electronic business card (e.g., vCard format and CSV format).

The object of the present invention is to reduce a storage device's thickness and embody extensive purposes.

The other object of the present invention is to reduce a storage device's thickness and make the present invention conveniently employed and properly accommodated.

To achieve the said purposes, the principal technical schemes used in the present invention are based on the following technical program. The present invention is a screen storage device plugged into a computer's port (as a data transfer interface) and comprising at least an integrated circuit module and a carrier plate; the integrated circuit module has both a substrate, which has an inner surface and an outer surface with a plurality of metal contacts provided, and at least an electronic device installed on the inner surface of the substrate; the carrier plate is used to carry the integrated circuit module and develop at least two folding sections with the carrier plate folded; the metal contacts are exposed outside when the folding section and the integrated circuit module are oppositely stacked; the height of the integrated circuit module plus the heights of the folding sections is not more than the height unit of a Universal Serial Bus (USB) male connector.

The purposes of the present invention and solutions for its technical problems are further embodied with the following techniques.

In the said screen storage device, the electronic device comprises at least a memory chip and at least a control device or at least an integrated chip.

In the said screen storage device, the inner surface of the substrate is developed to be a package body encasing the electronic device.

In the said screen storage device, the metal contacts are compatible to the data transfer interface of a USB male connector (Series A).

In the said screen storage device, the width ($W_1$) of the integrated circuit module (10) plus the widths of the folding sections (21a, 21b) is not more than 12.1 millimeters as one of the folding sections (21a, 21b) and the integrated circuit module (10) are oppositely stacked.

In the said screen storage device, the integrated circuit module is covered inside the carrier plate and makes the metal contacts exposed outside.

In the said screen storage device, the integrated circuit module can be adhered to and connected to the carrier plate with an adhesive and a tenon structure, respectively.

In the said screen storage device, the carrier plate can be manufactured in various materials such as plastic, cardboard, or metal, or a combination of materials thereof.

In contrast to the prior arts, the present invention is effective in reducing a USB device's thickness and making the present invention extensively employed, conveniently used, and properly accommodated.

BRIEF DESCRIPTIONS OF THE DRAWINGS

DETAILED DESCRIPTIONS OF THE PREFERRED EMBODIMENTS

Figure 1:
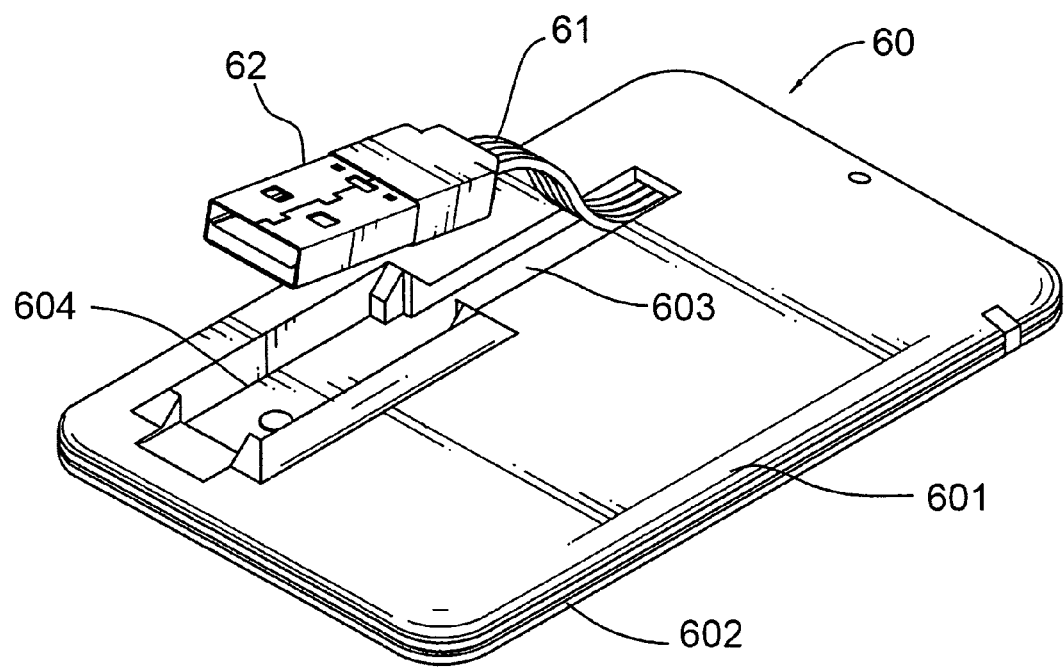
FIG. 1 is the perspective view of a flash disk structure manufactured with the prior arts.
Figure 2A:
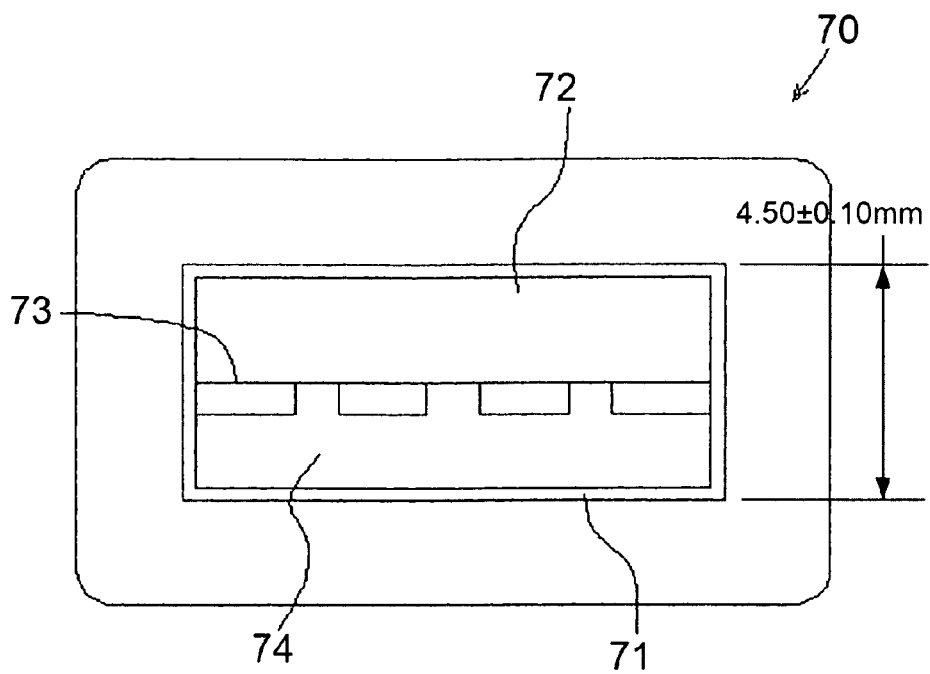
FIG. 2A is the sectional view of a Universal Serial Bus (USB) male connector (Series A).
Figure 2B:
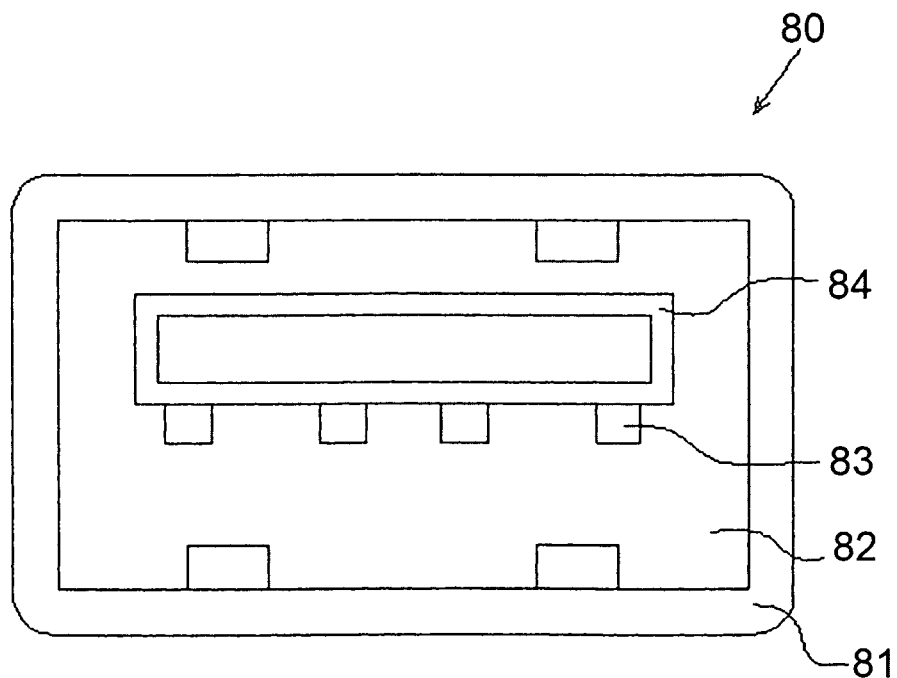
FIG. 2B is the sectional view of a Universal Serial Bus (USB) female connector (Series A).
Figure 3:
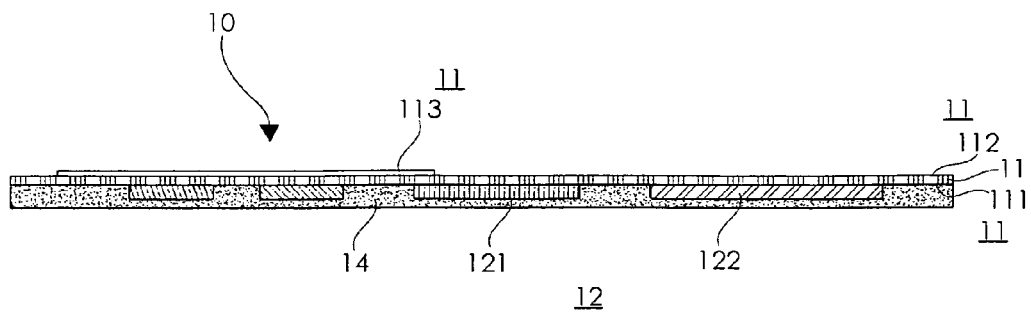
FIG. 3 is the sectional view of the integrated circuit module in the first embodiment of the present invention of a screen USB device.
Figure 4:
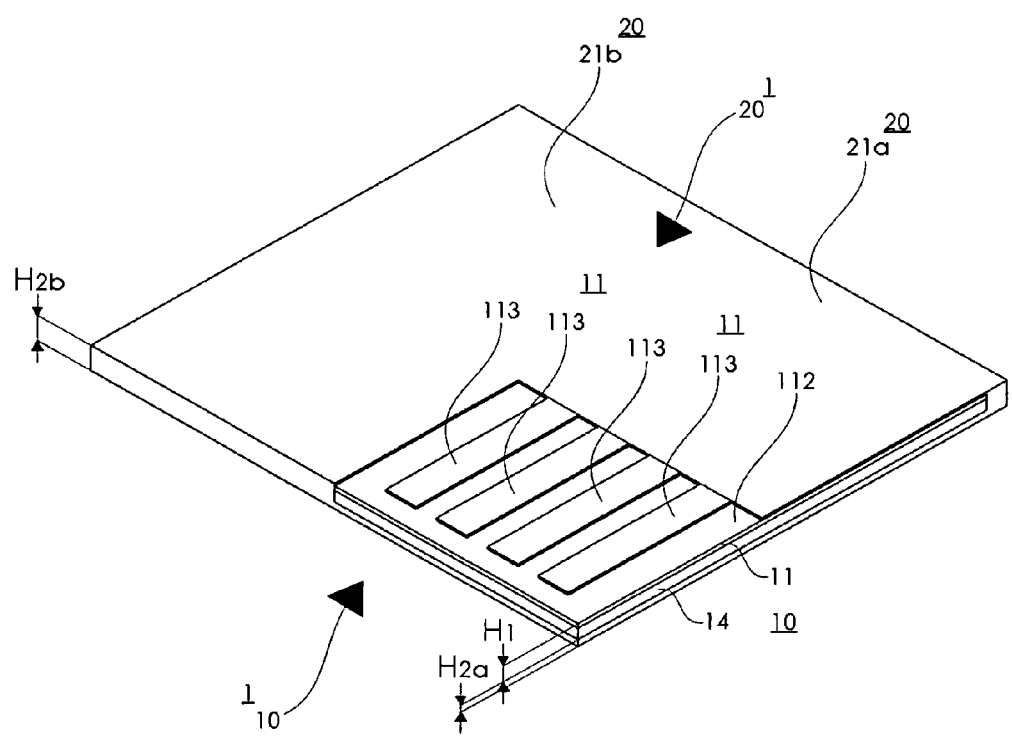
FIG. 4 is the perspective view for the first embodiment of the present invention of a screen USB device.

For purposes, characteristics, and effects obviously and easily understood, the preferred embodiments of the present invention are particularly interpreted as follows:

FIGS. 3, 4, 5, and 6 indicate a first embodiment of the present invention of a screen storage device (1). Referring to FIGS. 3 and 4 first which display an integrated circuit module (10) and a carrier plate (20). In this regard, the integrated circuit module (10) can be a Chip-On-Board (COB) package style comprising a substrate (11) and at least an electronic device (12) wherein the substrate (11) has an inner surface (111) and an outer surface (112) with a plurality of metal contacts (113) provided.

Specifically, the metal contacts (113) are developed to be a data transfer interface compatible to a Universal Serial Bus (USB) male connector (Series A).

In addition, the electronic device (12) is installed on the inner surface (111) of the substrate (11) and preferably comprises at least a memory chip (121), at least a control device (122), or at least an integrated chip which integrates a memory chip and a control device. In this embodiment, the electronic device (12) comprises at least a memory chip (121) and at least a control device (122) and is electrically connected to the inner surface (111) of the substrate (11) by a wire bonding or flip chip technique (not shown in figures).

Specifically, the substrate (11) which is usually a high-density double-sided multi-layer printed circuit board with circuits (not shown in figures) developed inside as one interface for transmit of electricity allows the metal contacts (113) to be electrically connected to the electronic device (12) via the substrate (11).

The memory chip (12) could be several types of memories such as flash memory, Static-Random-Access-Memory (SRAM), Application-Specific-Integrated-Circuit (ASIC), or Synchronous-Dynamic-Random-Access-Memory (SDRAM).

Preferably, the inner surface (111) of the substrate (11) can be developed to be a package body (14) encasing the electronic device (12) inside. Additionally, passive components (not shown in figures) necessary to the USB device (1) are also installed on the inner surface (111) of the substrate (11) and encased in the package body (14).

Figure 5:
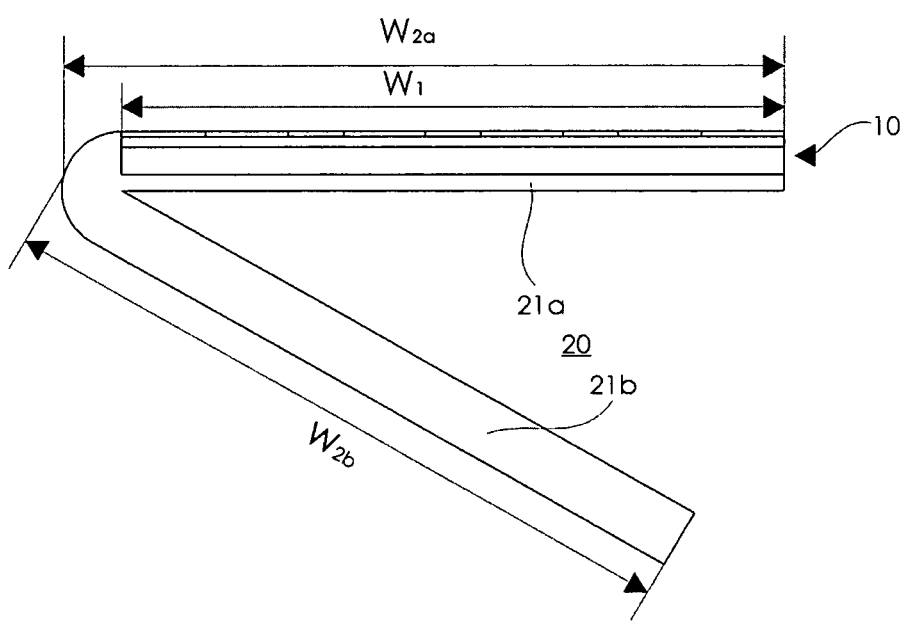
FIG. 5 is the perspective view for the stacking process in the first embodiment of the present invention of a screen USB device.
Figure 6:
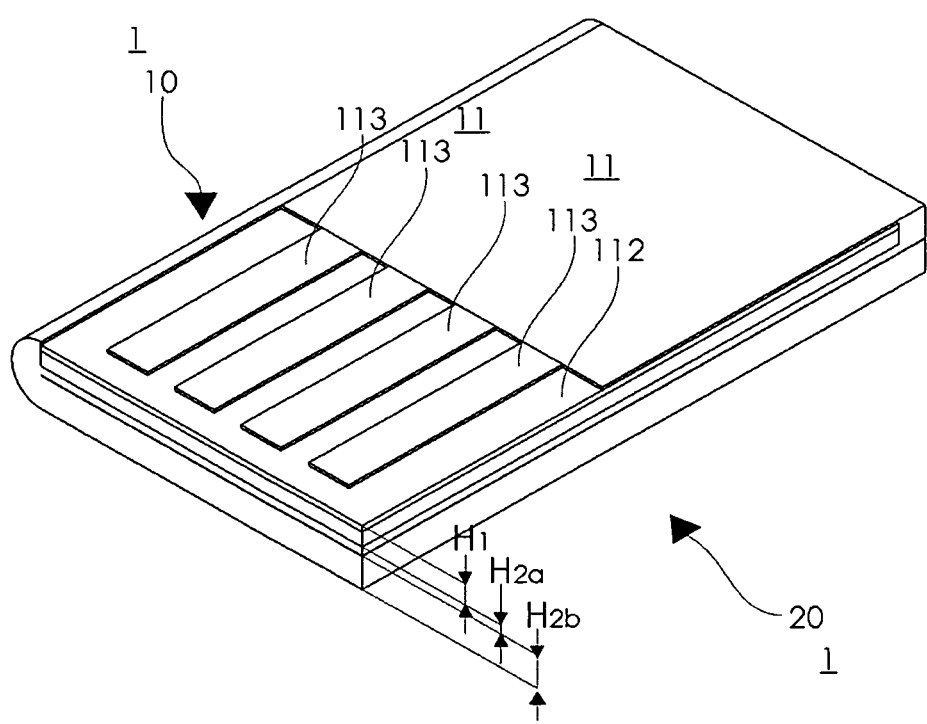
FIG. 6 is the perspective view for the stacked status in the first embodiment of the present invention of a screen USB device.

Referring to FIGS. 4, 5, and 6 which indicate a carrier plate (20) used to carry the integrated circuit module (10) and preferably manufactured in various materials such as plastic, cardboard, metal or a combination of these materials thereof. When the carrier plate (20) is folded, there are at least two folding sections (21a, 21b) developed on the carrier plate (20). In the event of one of the folding sections (21a, 21b) and the integrated circuit module (10) oppositely stacked (for instance, styles of folding stack containing but not limited to a multi-folding screen, a folding fan, and an accordion) making the metal contacts (113) exposed outside, the height ($H_1$) of the integrated circuit module (10) plus the heights ($H_{2a}$, $H_{2b}$) of the folding sections (21a, 21b) is not more than the height unit of a Universal Serial Bus (USB) male connector. In this regard, this embodiment is described according to the data transfer interface of a Universal Serial Bus (USB) male connector (Series A).

In the case of one of the folding sections (21a, 21b) and the integrated circuit module (10) oppositely stacked, the width ($W_1$) of the integrated circuit module (10) plus the widths ($W_{2a}$, $W_{2b}$) of the folding sections (21a, 21b) is not more than 12.1 millimeters which conform to the specification for the width of a Universal Serial Bus (USB) male connector (Series A).

Specifically, referring to FIG. 4 which indicates the integrated circuit module (10) encased in the carrier plate (20) makes the metal contacts (113) exposed outside that are plugged into and electrically connected to a computer's port (as a data transfer interface). Additionally, the integrated circuit module (10) is adhered to and connected to the carrier plate (20) with an adhesive (not shown in the figure) and a tenon structure (not shown in the figure), respectively. In a word, the present invention should not be limited to a connection of the integrated circuit module (10) and the carrier plate (20) in view of a connection between objects based on common general knowledge.

Figure 7:
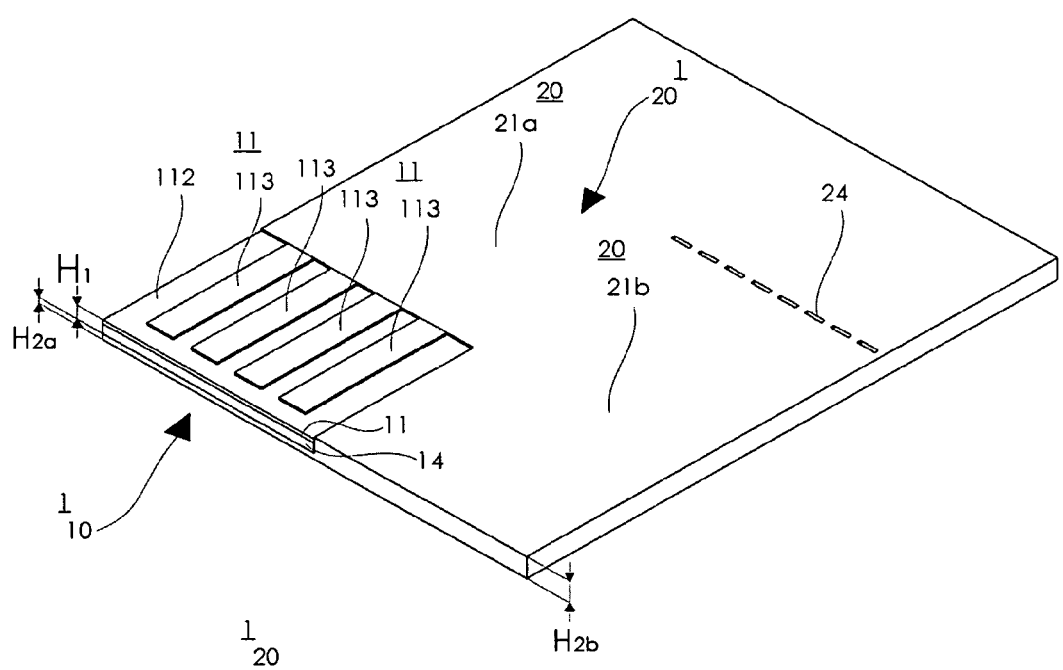
FIG. 7 is the perspective view for the second embodiment of the present invention of a screen USB device.
Figure 8:
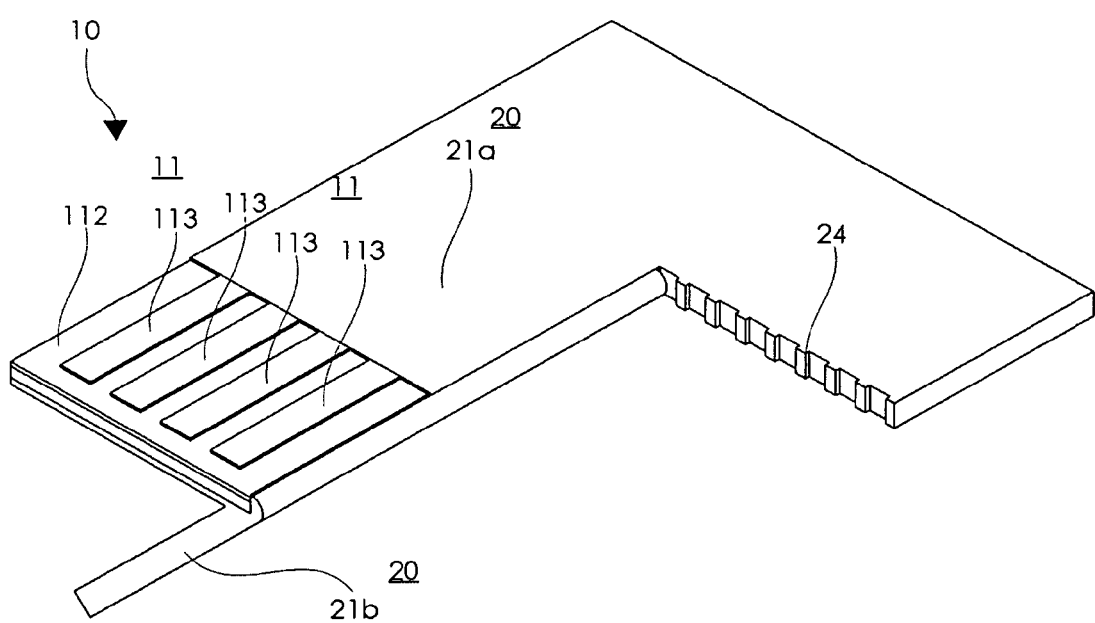
FIG. 8 is the perspective view for the stacking process in the second embodiment of the present invention of a screen USB device.
Figure 9:
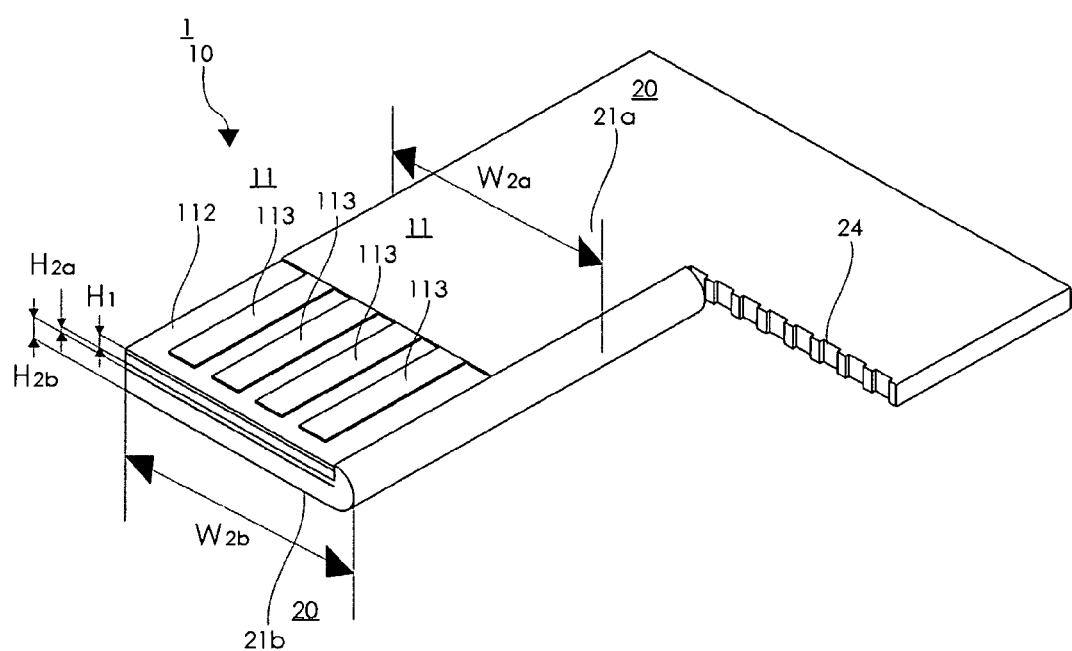
FIG. 9 is the perspective view for the stacked status in the second embodiment of the present invention of a screen USB device.

Referring to FIGS. 7 and 9 which indicate a second embodiment of the present invention wherein symbols identical to those in the first embodiment and FIGS. 3, 4, 5, and 6 are not repeatedly explained hereinafter. The difference between the second embodiment and the first embodiment is the carrier plate (20) developed to be at least a cutting line (24) which is used to separate the carrier plate (20). The cutting line (24) is effective to rapidly fold the carrier plate (20) and make one of the folding sections (21a, 21b) and the integrated circuit module (10) oppositely stacked. Referring to FIG. 7 which represents one type of cutting line (24), i.e., the cutting line used to separate the carrier plate in this embodiment is not the only style but is effective in rapidly folding the carrier plate (20).

Figure 10:
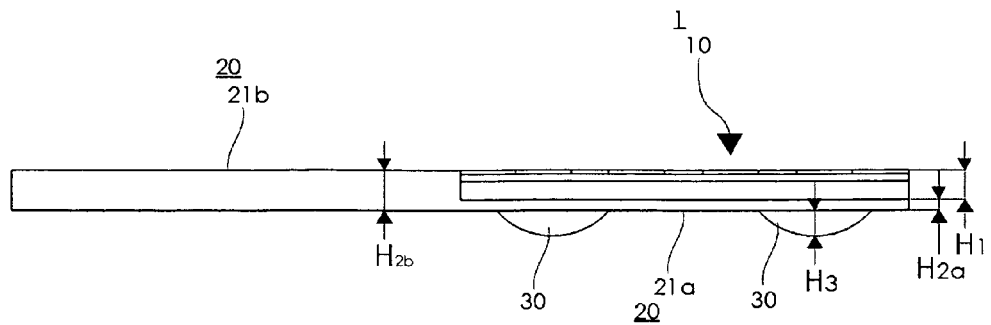
FIG. 10 is the front view for the third embodiment of the present invention of a screen USB device.
Figure 11:
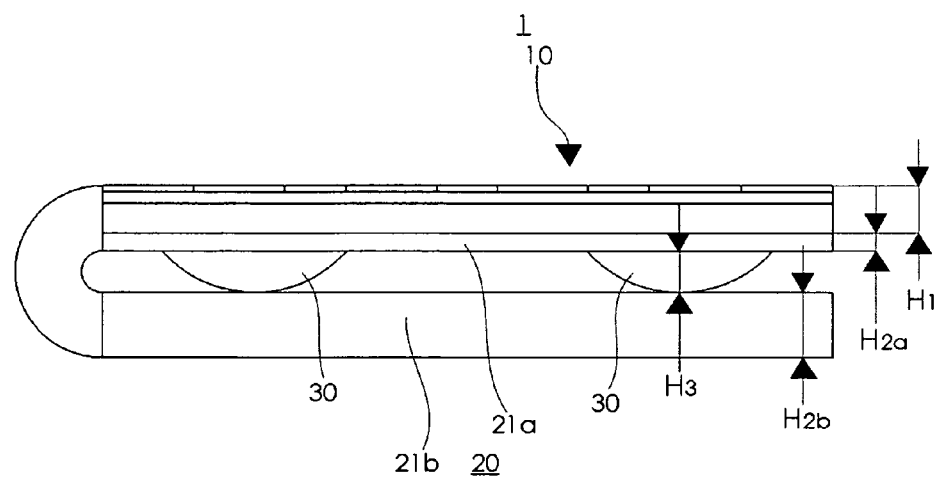
FIG. 11 is the front view for the stacked status in the third embodiment of the present invention of a screen USB device.

Referring to FIGS. 10 and 11 which indicate a third embodiment of the present invention wherein symbols identical to those in the first embodiment and FIGS. 3, 4, 5, and 6 are not repeatedly explained hereinafter.

The difference between the third embodiment and the first embodiment is the carrier plate (20) capable of carrying at least a support (30) which combines the carrier plate (20) to become an integral unity or is adhered to the carrier plate (20) with an adhesive. In this embodiment, the support (30) and the carrier plate (20) are developed to be an integral unity.

In the case of the support (30) and the carrier plate (20) oppositely arranged, the height ($H_1$) of the integrated circuit module (10) plus the height ($H_3$) of the support firstly and the heights ($H_{2a}$, $H_{2b}$) of the folding sections secondly is not more than 2.5 millimeters which contribute to an electrical connection with the metal contacts (113) plugged into a computer's port (as a data transfer interface) in the embodiment described according to the data transfer interface of a Universal Serial Bus (USB) male connector (Series A).

Figure 12:
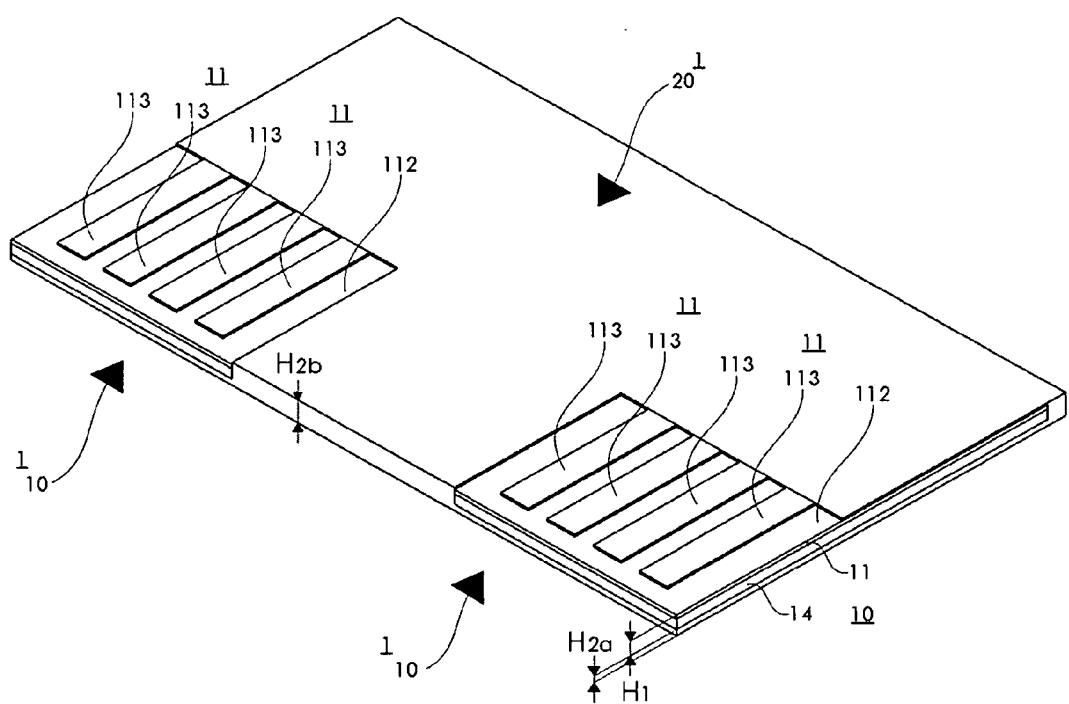
FIG. 12 is the perspective view for the fourth embodiment of the present invention of a screen USB device.

Referring to FIG. 12 which indicates a fourth embodiment of the present invention wherein symbols identical to those in the first embodiment and FIGS. 3, 4, 5, and 6 are not repeatedly explained hereinafter.

The difference between the fourth embodiment and the first embodiment is the number of the integrated circuit modules (10) is not one only, i.e., two or more integrated circuit modules (10) are carried on a carrier plate (20) which contains features identical to those in the first embodiment or the second and the third embodiments definitely.

No matter which embodiment hereinabove is quoted, the present invention is not limited to each of them, and any change and modification corresponding to the said embodiments and made by anyone skilled in the art within descriptions and drawings of the present invention do not depart from the technical scope protected by the present invention which accordingly depends on the claims listed as follows.

The present invention is to provide a screen USB device comprising at least an integrated circuit module and a carrier plate which is folded to develop at least two folding sections in which the folding section and the integrated circuit module oppositely stacked make the integrated circuit module's height plus the folding sections' heights become not more than the height unit of a Universal Serial Bus (USB) male connector by specifications and embody the integrated circuit module's height effectively reduced as well as the present invention extensively employed, conveniently used, and properly accommodated.

Accordingly, the present invention that is different from general conventional storage devices but regarded as creative work among similar structures meets patentability and is applied for the patent.

It must be stressed that the said descriptions are only the preferred embodiments of the present invention and any equivalent change in descriptions, claims, or drawings of the present invention is under protection of the technical scope of the present invention which accordingly depends on claims specified hereinafter.

What is claimed is:

1. A screen storage device (1) which is plugged into a computer's port comprising:
    at least an integrated circuit module (10), comprising: a substrate (11) and at least an electronic device (12) wherein the substrate (11) has an inner surface (111) and an outer surface (112) with a plurality of metal contacts (113) and the electronic device (12) is installed on the inner surface (111) of the substrate (11);
    a carrier plate (20) used to carry the integrated circuit module (10) and folded to make the carrier plate (20) developed to be at least two folding sections (21a, 21b);
    at least a support (30), wherein the support (30) is combined with the carrier plate (20) to become an integral unity or is adhered to the carrier plate (20) with an adhesive;
    wherein, the support (30) and the carrier plate (20) are oppositely arranged, the height (H1) of the integrated circuit module (10) plus the height (H3) of the support firstly and the heights (H2a, H2b) of the folding sections secondly is not more than 2.5 millimeters which contribute to an electrical connection with the metal contacts (113) plugged into a computer's port.

2. The screen storage device (1) according to claim 1 wherein the electronic device (12) comprises at least a memory chip (121), at least a control device (122) or at least an integrated chip.

3. The screen storage device (1) according to claim 1 wherein the inner surface (111) of the substrate (11) is developed to be a package body (14) encasing the electronic device (12).

4. The screen storage device (1) according to claim 1 wherein the metal contacts (113) are compatible to the data transfer interface of a Universal Serial Bus (USB) male connector (Series A).

5. The screen storage device (1) according to claim 1 wherein the width (W1) of the integrated circuit module (10) plus the widths (W2a, W2b) of the folding sections (21a, 21b) is not more than 12.1 millimeters with one of the folding sections (21a, 21b) and the integrated circuit module (10) oppositely stacked.

6. The screen storage device (1) according to claim 1 wherein the integrated circuit module (10) is encased in the carrier plate (20) and makes the metal contacts (113) exposed outside.

7. The screen storage device (1) according to claim 1 wherein the carrier plate (20) can be manufactured in various materials such as plastic, cardboard, metal, or a combination of these materials thereof.

* * * * *